United States Patent
Yeh et al.

(10) Patent No.: US 8,657,963 B2
(45) Date of Patent: Feb. 25, 2014

(54) IN-SITU BACKSIDE CLEANING OF SEMICONDUCTOR SUBSTRATE

(75) Inventors: Ming-Hsi Yeh, Hsinchun (TW); Kuo-Sheng Chuang, Hsinchu (TW); Ying-Hsueh Chang Chien, New Taipei (TW); Chi-Ming Yang, Hsian-San District (TW); Chin-Hsiang Lin, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 54 days.

(21) Appl. No.: 13/240,583

(22) Filed: Sep. 22, 2011

(65) Prior Publication Data

US 2013/0074872 A1    Mar. 28, 2013

(51) Int. Cl.
*B08B 1/00*    (2006.01)
(52) U.S. Cl.
USPC ............................................................ 134/6
(58) Field of Classification Search
None
See application file for complete search history.

(56) References Cited

U.S. PATENT DOCUMENTS

| | | | |
|---|---|---|---|
| 5,853,961 A | 12/1998 | Sakai et al. | |
| 5,887,605 A | 3/1999 | Lee et al. | |
| 6,594,847 B1 | 7/2003 | Krusell et al. | |
| 6,702,202 B1 * | 3/2004 | Boyd et al. | 239/225.1 |
| 6,824,621 B2 | 11/2004 | Shibagaki | |
| 7,231,682 B1 * | 6/2007 | Boyd et al. | 15/77 |
| 2002/0062839 A1 * | 5/2002 | Verhaverbeke et al. | 134/1.3 |
| 2003/0041878 A1 * | 3/2003 | Shimada et al. | 134/6 |
| 2006/0016029 A1 * | 1/2006 | Mikhaylichenko et al. | 15/102 |
| 2008/0156346 A1 | 7/2008 | Wang et al. | |
| 2009/0199869 A1 * | 8/2009 | Kago et al. | 134/6 |
| 2009/0205677 A1 | 8/2009 | Thakur et al. | |

OTHER PUBLICATIONS

Dictionary definition of Nozzle.*
Manish Chandhok; Kent Frasure; E. Steve Putna; Todd R. Younkin; Willy Rachmady; Uday Shah and Wang Yuen; "Improvement in Linewidth Roughness by Postprocessing;" Nov./Dec. 2008; pp. 2265-2270; J. Vac. Sci. Technol. B 26(6); American Vacuum Society.
Dan Syverson; "Implant Stripping: Steam Injection for Uniform Wet Stripping;" 2010; Issue II; pp. 20-23; www.euroasiasemiconductor.com.
Ming-Hsi Yeh; Yu-Fu Lin; Shao-Yen Ku; Chi-Ming Yang and Chin-Hsiang Lin; "Cleaning Process for Semiconductor Device Fabrication:" U.S. Appl. No. 13/022,931, filed Feb. 8, 2011; 19 Pages.
Ming-Hsi; Kuo-Sheng Chuang; Ying-Hsueh Chien; Chi-Ming Yang; Chi-Wen Liu and Chin-Hsiang Lin; "Chemical Dispersion Method and Device;" U.S. Appl. No. 13/198,420, filed Aug. 4, 2011; 25 Pages.
Ming-His Yeh; Kuo-Sheng Chuang; Ying-Hsueh Chang Chien; Chi-Ming Yang and Chin-Hsiang Lin; "Semiconductor Device Cleaning Method and Apparatus;" U.S. Appl. No. 13/210,998, filed Aug. 16, 2011; 23 Pages.

* cited by examiner

*Primary Examiner* — Nicole Blan
(74) *Attorney, Agent, or Firm* — Haynes and Boone, LLP

(57) ABSTRACT

The present disclosure provides a method and apparatus for cleaning a semiconductor wafer. In an embodiment of the method, a single wafer cleaning apparatus is provided and a wafer is positioned in the apparatus. A first chemical spray is dispensed onto a front surface of the wafer. A back surface of the wafer is cleaned while dispensing the first chemical spray. The cleaning of the back surface may include a brush and spray of cleaning fluids. An apparatus operable to clean the front surface and the back surface of a single semiconductor wafer is also described.

13 Claims, 7 Drawing Sheets

US 8,657,963 B2

IN-SITU BACKSIDE CLEANING OF SEMICONDUCTOR SUBSTRATE

BACKGROUND

Embodiments of this disclosure relate generally to semiconductor device fabrication, and more particularly to a method of cleaning a semiconductor wafer during the fabrication.

Recent trends in the progression of semiconductor device fabrication have included the introduction of additional single wafer cleaning processes. Single wafer cleaning processes are replacing some wet-bench type cleans as they can provide for improved cleaning efficiency and process stability.

An issue with single wafer cleaning tools however is that the backside of the wafer is not cleaned. Instead, typically an extra processing step is required to clean the back-side of a semiconductor wafer. This requires additional costs with respect to tools, factory space, cycle-time and the like. Thus, what is desired are fabrication process(es) that provide for single wafer cleaning that improve one or more of these issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
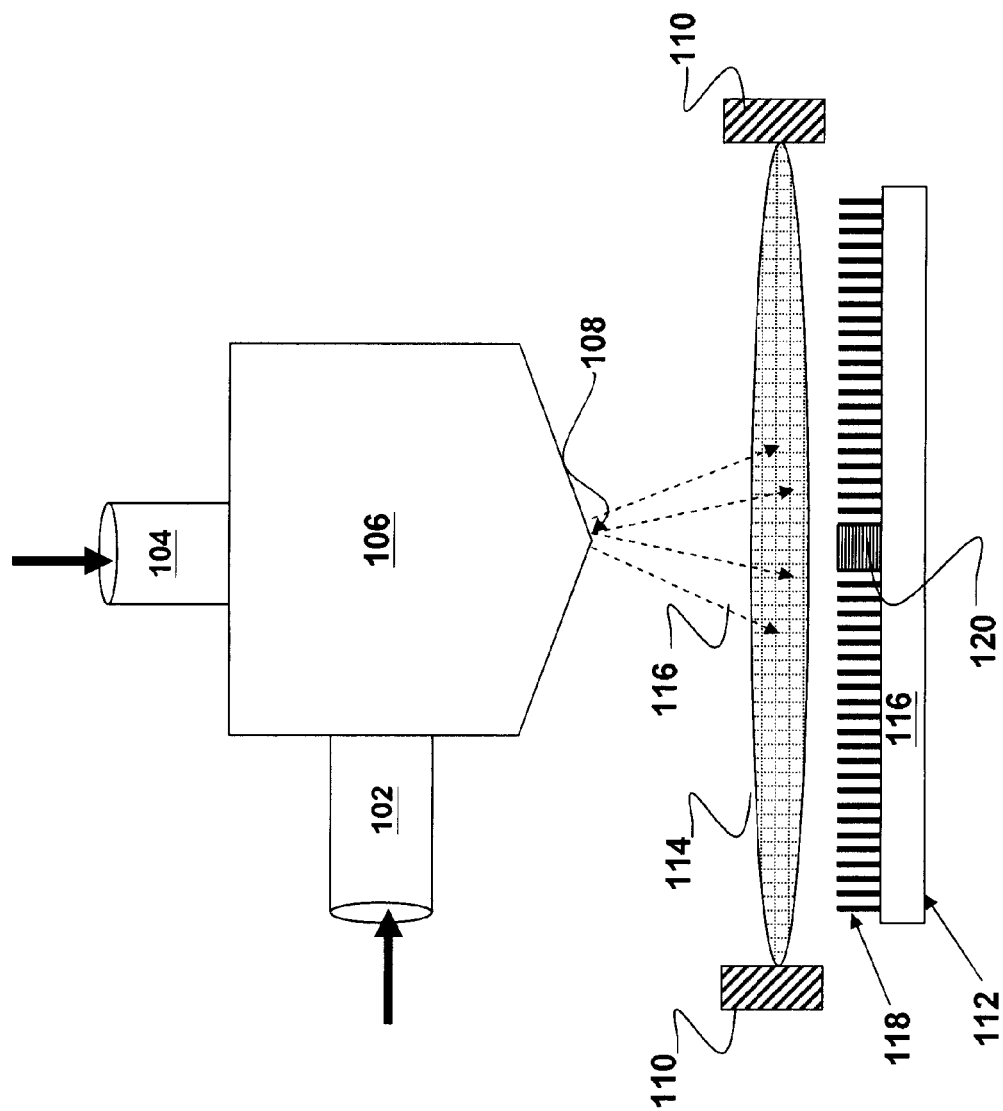
FIG. 1 is cross-sectional view of an embodiment of a single wafer cleaning apparatus according to one or more aspects of the present disclosure.

Illustrated in FIG. 1 is a single substrate (e.g., wafer) cleaning apparatus 100. The single wafer cleaning apparatus 100 includes inlets 102 and 104, chamber 106, a chemical dispenser 108, a wafer positioning device 110, and a brush bar 112. A wafer 114 is positioned in the single wafer cleaning apparatus 100. A spray 116 is dispensed from the dispenser 108 and is incident the wafer 114. One or more of the devices described above may be provided in a chamber.

The inlets 102 and/or 104 may provide chemical for distribution to the wafer 114 for cleaning and/or etching the wafer 114. The term chemical as used herein substances created by reaction as well as naturally occurring reactive and/or inert substances. For example, exemplary chemicals would include nitrogen ($N_2$), air, water (including de-ionized water), acids, bases, solutions, pure substances, and the like. As also used herein, a solution of chemicals may be homogeneous or substantially homogeneous, but may not necessarily be so. The inlets 102 and 104 may be connected to a cleaning fluid supply (or chemical supply (e.g., de-ionized water, nitrogen, air, or other chemical solution)). The cleaning fluid provided may be heated prior to, during or after the delivery to the inlets 102 and 104.

In an embodiment, a cleaning fluid of nitrogen ($N_2$) is delivered to the chamber 106 via the inlet 102. The $N_2$ gas may be a high pressure flow. The $N_2$ gas flow rate may be between approximately 0 L/min and approximately 70 L/min. Other examples of chemical delivered via inlet 102 include by the argon and/or air under high pressure flow. In an embodiment, an atomized spray is provided via the inlet 102 such that a physics force is applied to the wafer via the dispenser 108.

In an embodiment, a cleaning fluid is delivered to the chamber 106 via the inlet 104. The cleaning fluid may include, for example, APM (Ammonia hydroxide-hydrogen peroxide-wafer mixture), de-ionized water (DIW), SC1 (de-ionized water (DI), $NH_4OH$, $H_2O_2$), diluted $NH_4OH$, SC2 (DI, HCl, $H_2O_2$), ozonated de-ionized water ($DIWO_3$), SPM ($H_2SO_4$, $H_2O_2$), SOM ($H_2SO_4$, $O_3$), SPOM, $H_3PO_4$, dilute hydrofluoric acid (DHF), HF, HF/EG, HF/$HNO_3$, $NH_4OH$, and/or other suitable chemicals. The cleaning fluid delivered via inlet 104 may be between approximately 0 degrees Celsius and approximately 250 degrees Celsius.

The dispenser 108 may include a nozzle, a plurality of nozzles, a spray bar, a plurality of spray bars and/or other configuration known now or later developed for introducing the spray 116 to the front side of the wafer 114. The spray 116 may include the cleaning fluid provided by the inlet 102 and/or the inlet 104. For example, in an embodiment, the spray 116 includes an $N_2$ (e.g., atomized) high pressure flow and a cleaning solution (e.g., APM). However, numerous other embodiments are possible and within the scope of this disclosure.

The wafer 114 may include silicon. Alternatively, the wafer 114 includes germanium, silicon germanium or other proper semiconductor materials. The wafer 114 may include regions where one or more semiconductor devices, or portions thereof, are formed (e.g., field effect transistors). Various isolation features may be formed in the wafer 114 interposing various doped regions (e.g., n-wells and p-wells) formed in various active regions. The wafer 114 includes a plurality of individual die formed thereon, which may be subsequently diced to form semiconductor devices. The wafer 114 may be greater than approximately 250 mm. In an embodiment, the wafer 114 is approximately 450 mm in diameter. A pattern of features may be formed on the frontside of the wafer 114 (such that spray 116 is incident the pattern or portion thereof). The pattern of features may be associated with a semiconductor device or portion there of, such as a plurality of gate structures (e.g., polysilicon features, metal gate features, etc), source/drain regions, interconnect lines or vias, dummy features, and/or other suitable patterns.

The wafer positioning device 110 includes one or more devices that position and/or move the wafer 114 under the dispenser 108. In an embodiment, the wafer positioning device 110 includes a plurality of chuck pins. The wafer positioning device 110 may contact the side portions of the wafer 114. The wafer positioning device 110 is operable to hold a single wafer. In an embodiment, the wafer positioning device 110 rotates the wafer 114 about its radial axis. Example wafer rotation speeds include between approximately 10 rpm and approximately 2500 rpm.

The brush bar 112 is positioned below the wafer 114. The brush bar 112 includes a portion that is operable to contact the backside of the wafer 114. The brush bar 112 includes a base 116, brush 118 (e.g., bristles), and a nozzle 120. However, other configurations are possible including those discussed below with reference to FIGS. 3, 4, 5, and 6. The brush bar 112 may contact the backside of the wafer 114. For example, the brush 118 may contact the backside of the wafer 114. The nozzle 120 may be a single outlet and/or any plurality of outlets. The nozzle 120 may be connected to a chemical supply. Example cleaning fluids supplied to and by the nozzle 120 include, for example, APM (Ammonia hydroxide-hydrogen peroxide-wafer mixture), de-ionized water (DIW) (including hot DIW), SC1 (de-ionized water (DI), $NH_4OH$, $H_2O_2$), diluted $NH_4OH$, SC2 (DI, HCl, $H_2O_2$), ozonated de-ionized water ($DIWO_3$), SPM ($H_2SO_4$, $H_2O_2$), SOM ($H_2SO_4$, $O_3$), SPOM, $H_3PO_4$, dilute hydrofluoric acid (DHF), HF, HF/EG, $HF/HNO_3$, $NH_4OH$, HF, and/or other suitable chemicals. The chemicals (or cleaning fluids) delivered via nozzle 120 may be between approximately 0 degrees Celsius and approximately 250 degrees Celsius. In a further embodiment, the chemicals delivered by nozzle 120 are between approximately 23 degrees Celsius and approximately 80 degrees Celsius. The chemicals (e.g., spray) from nozzle 120 are incident the backside of the wafer 114.

In an embodiment, the brush 118 includes a flexible, comb-like configuration of material. Other embodiments are possible, including, for example, pads. Exemplary materials include polyvinyl alcohol (PVA) or other polymer. The brush 118 may include a plurality of rotating brushes. Thus, the brush bar 112 provides chemical and physical cleaning to the backside of the wafer 114.

In an embodiment, the spray 116 is incident the frontside of the wafer 114 substantially simultaneously with a chemical spray from the nozzle 120 being incident the backside of the wafer 114. In an embodiment, the spray 116 is incident the frontside of the wafer 114 substantially simultaneously with the brush 118 being incident the backside of the wafer 114. Thus, the apparatus 100 allows for the simultaneous cleaning of the frontside and backside of the wafer 114. Therefore, the apparatus 100 provides for an in-situ backside clean (e.g., brush and/or spray) with a cleaning process for the frontside of the wafer.

The chemical provided to the backside of the wafer 114 via the nozzle 120 of the brush bar 112 may be the same as or different than that of the spray 116. The temperature of chemical provided to the backside of the wafer 114 via the nozzle 120 of the brush bar 112 may be the same as or different than the spray 116. The cleaning apparatus 100 may further include megasonic capabilities in applying the spray 116 and/or the brush bar 112 to the front/back side of the wafer 114 respectively.

Figure 2:
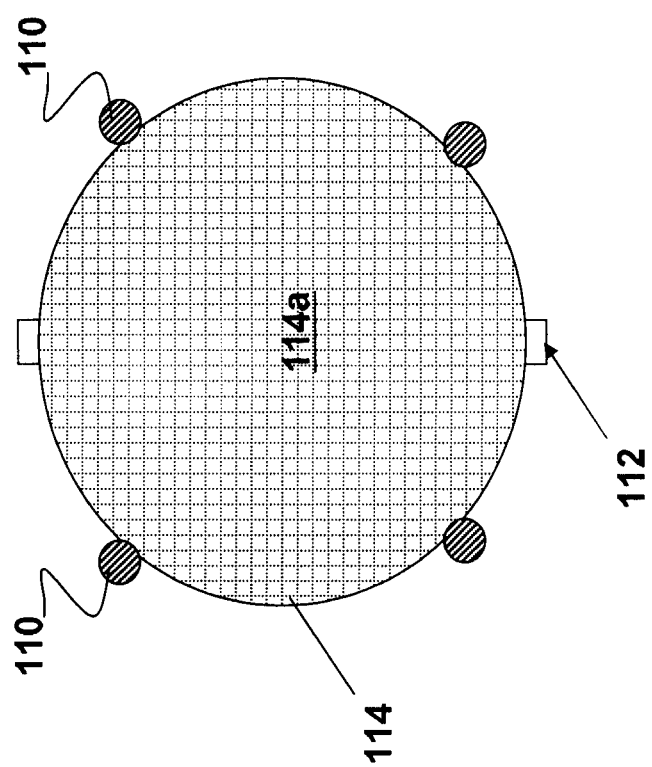
FIG. 2 is top view of an embodiment of a wafer in a single wafer cleaning apparatus according to one or more aspects of the present disclosure.

Referring now to FIG. 2, illustrated is a top view of the wafer 114. FIG. 2 may illustrate the top view of the wafer 114, denoted 114a, in a single wafer cleaning apparatus such as the single wafer cleaning apparatus 100, described above with reference to FIG. 1. The plurality of wafer positioning devices 110 are operable to hold, rotate, and/or otherwise move the wafer 114. A plurality of dies are formed on the wafer 114, which may be subsequently singulated.

Figure 3:
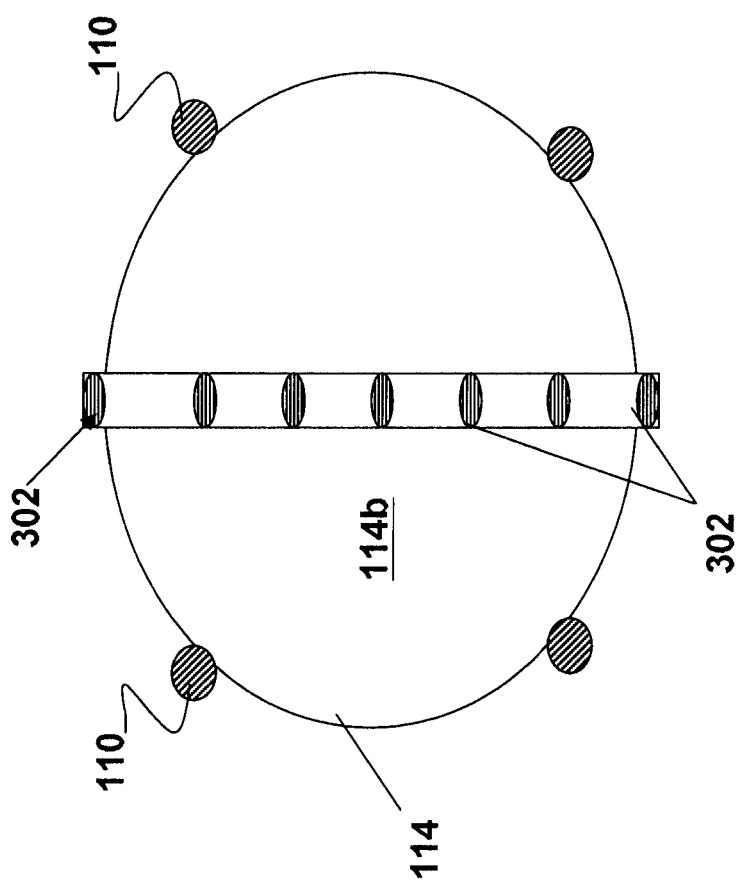
FIG. 3 is a bottom view of an embodiment of a wafer in a single wafer cleaning apparatus according to one or more aspects of the present disclosure.

Referring now to FIG. 3, illustrated is a bottom view of the wafer 114, denoted 114b. The wafer 114 is held by the wafer positioning devices 110, described in further detail above with reference to FIG. 1. FIG. 3 illustrates an embodiment of a brush bar 300. The brush bar 300 may be substantially similar to the brush bar 112, described above with reference to FIG. 1. The brush bar 300 may be included in the single wafer cleaning apparatus 100, also described above with reference to FIG. 1.

The brush bar 300 includes a plurality of nozzles 302 on the brush bar 300. The brush bar 300 may also include a brush that contacts the backside 114b of the wafer 114. The nozzles 302 may be connected to a chemical supply. Example chemicals supplied to and by the nozzles 302 include, for example, APM (ammonia hydroxide-hydrogen peroxide-wafer mixture), de-ionized water (DIW), SC1 (de-ionized water (DI), $NH_4OH$, $H_2O_2$), diluted $NH_4OH$, SC2 (DI, HCl, $H_2O_2$), ozonated de-ionized water ($DIWO_3$), SPM ($H_2SO_4$, $H_2O_2$), SOM ($H_2SO_4$, $O_3$), SPOM, $H_3PO_4$, dilute hydrofluoric acid (DHF), HF, HF/EG, $HF/HNO_3$, $NH_4OH$, HF, and/or other suitable chemicals. The chemicals delivered via nozzles 302 may be between approximately 0 degrees Celsius and approximately 250 degrees Celsius. In a further embodiment, the chemicals delivered by nozzles 302 are between approximately 23 degrees Celsius and approximately 80 degrees Celsius. The chemicals from nozzle 302 are incident the backside 114b of the wafer 114. The chemicals delivered from each of the nozzles 302 may be the same or different.

Figure 4:
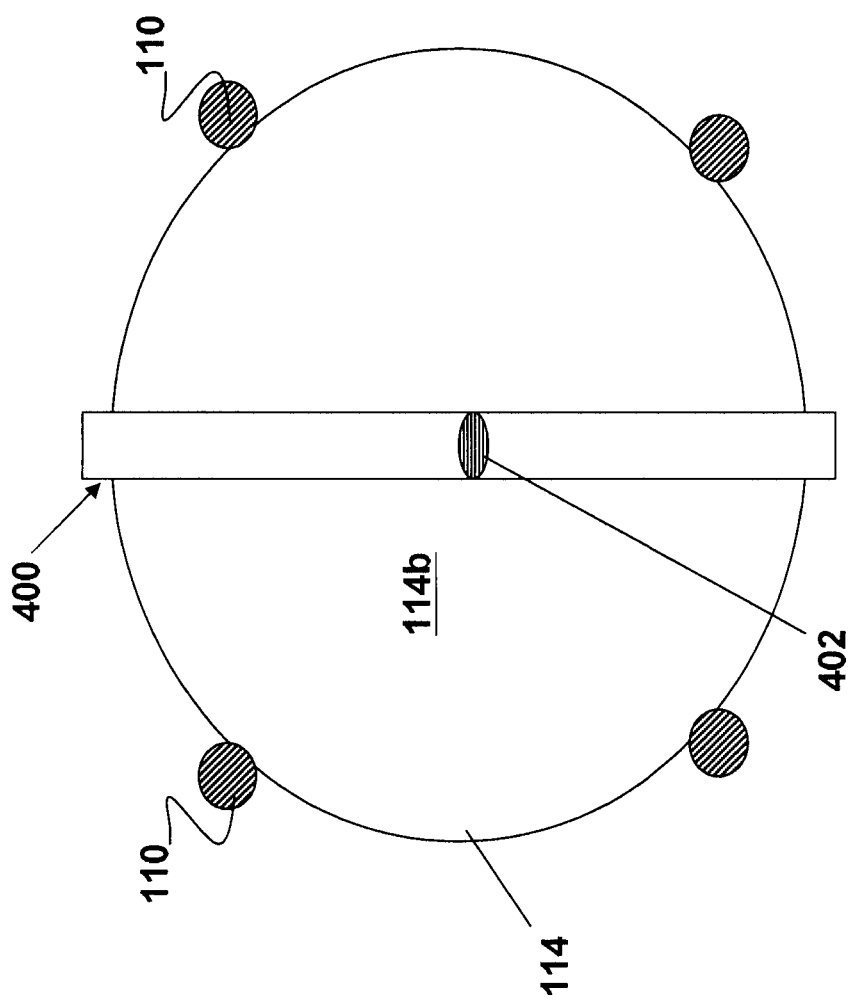
FIG. 4 is a bottom view of another embodiment of a wafer in a single wafer cleaning apparatus according to one or more aspects of the present disclosure.

Referring now to FIG. 4, illustrated is another bottom view of the wafer 114, denoted 114b. The wafer 114 is held by the wafer positioning devices 110, described in further detail above with reference to FIG. 1. FIG. 4 illustrates an embodiment of a brush bar 400. The brush bar 400 may be substantially similar to the brush bar 112, described above with reference to FIG. 1. The brush bar 400 may be included in the single wafer cleaning apparatus 100, also described above with reference to FIG. 1.

The brush bar 400 includes a single nozzle 402 on the brush bar 400. The brush bar 400 may also include a brush that contacts the backside 114b of the wafer 114. The nozzle 402 may be connected to a chemical supply. Example chemicals supplied to and by the nozzle 402 include, for example, APM (ammonia hydroxide-hydrogen peroxide-wafer mixture), de-ionized water (DIW), SC1 (de-ionized water (DI), $NH_4OH$, $H_2O_2$), diluted $NH_4OH$, SC2 (DI, HCl, $H_2O_2$), ozonated de-ionized water ($DIWO_3$), SPM ($H_2SO_4$, $H_2O_2$), SOM ($H_2SO_4$, $O_3$), SPOM, $H_3PO_4$, dilute hydrofluoric acid (DHF), HF, HF/EG, $HF/HNO_3$, $NH_4OH$, HF, and/or other suitable chemicals. The chemicals delivered via nozzle 402 may be between approximately 0 degrees Celsius and approximately 250 degrees Celsius. In a further embodiment, the chemicals delivered by nozzle 402 are between approximately 23 degrees Celsius and approximately 80 degrees Celsius. The chemicals from nozzle 402 are incident the backside 114b of the wafer 114. Though the nozzle 402 is illustrated as disposed aligned with the center of the wafer 114, other configurations are possible.

Figure 5:
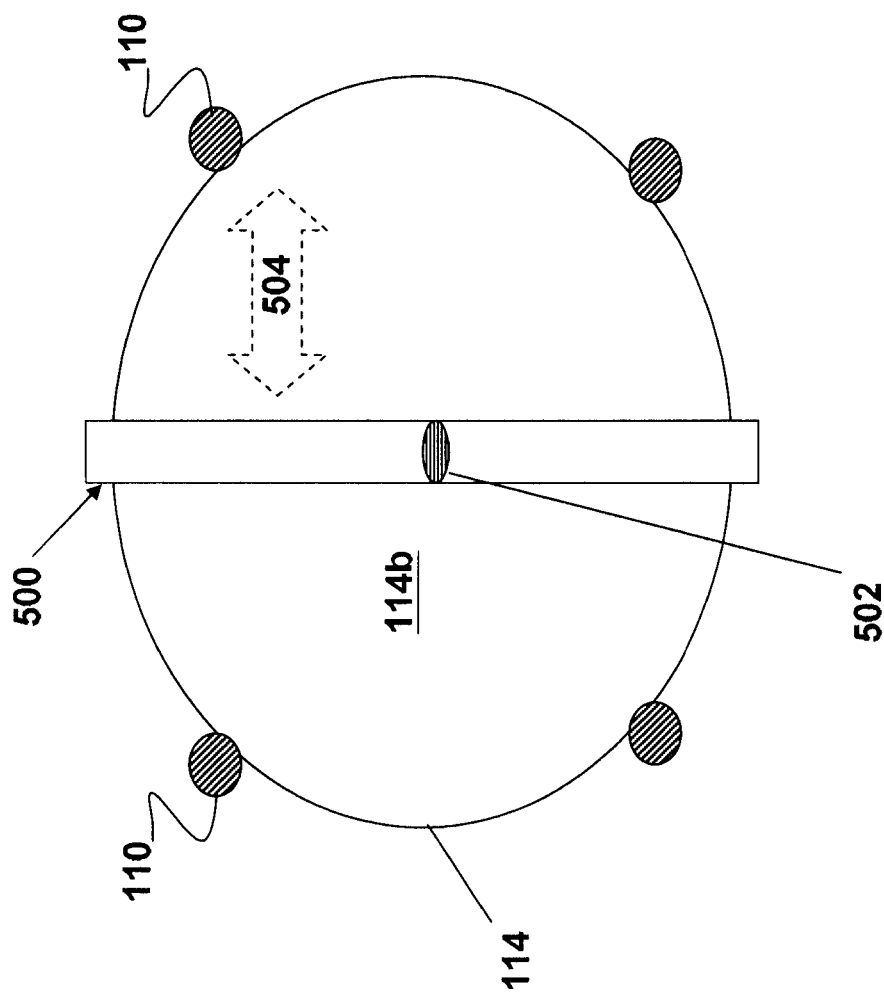
FIG. 5 is a bottom view of an embodiment of a wafer in a single wafer cleaning apparatus having a scan mode.

Referring now to FIG. 5, illustrated is another bottom view of the wafer 114, denoted 114b. The wafer 114 is held by the wafer positioning devices 110, described in further detail above with reference to FIG. 1. FIG. 5 illustrates an embodiment of a brush bar 500. The brush bar 500 may be substantially similar to the brush bar 112, described above with reference to FIG. 1. The brush bar 500 may be included in the single wafer cleaning apparatus 100, also described above with reference to FIG. 1.

The brush bar 500 includes a nozzle 502 on the brush bar 500. In other embodiments, the brush bar 500 may include a plurality of nozzles, for example, as illustrated above in FIG. 3. The brush bar 500 may also include a brush that contacts the backside of the wafer. The nozzles 502 may be connected to a chemical supply. Example chemicals supplied to and by the nozzle 502 include, for example, APM (ammonia hydroxide-hydrogen peroxide-wafer mixture), de-ionized water (DIW), SC1 (de-ionized water (DI), $NH_4OH$, $H_2O_2$), diluted $NH_4OH$, SC2 (DI, HCl, $H_2O_2$), ozonated de-ionized water ($DIWO_3$), SPM ($H_2SO_4$, $H_2O_2$), SOM ($H_2SO_4$, $O_3$), SPOM, $H_3PO_4$, dilute hydrofluoric acid (DHF), HF, HF/EG, HF/$HNO_3$, $NH_4OH$, HF, and/or other suitable chemicals. The chemicals delivered via nozzle 502 may be between approximately 0 degrees Celsius and approximately 250 degrees Celsius. In a further embodiment, the chemicals delivered by nozzle 502 are between approximately 23 degrees Celsius and approximately 80 degrees Celsius. The chemicals from nozzle 502 are incident the backside 114b of the wafer 114. Though the nozzle 502 is illustrated as disposed aligned with the center of the wafer 114, other configurations are possible.

The brush bar 500 is a scan mode brush bar. The scan mode provides for the brush bar 500 to traverse a portion of the wafer 114. The movement is illustrated by arrow 504, which indicate the brush bar 500 moves along a radius of the wafer 114. The movement 504 indicates a center-to-edge scan. However, other embodiments of movement are possible. It is noted that the wafer 114 may also be rotated along its radial axis during the scan movement 504. The scan speed, e.g., movement 504, may be between approximately 1 mm/second and approximately 200 mm/second.

Figure 6:
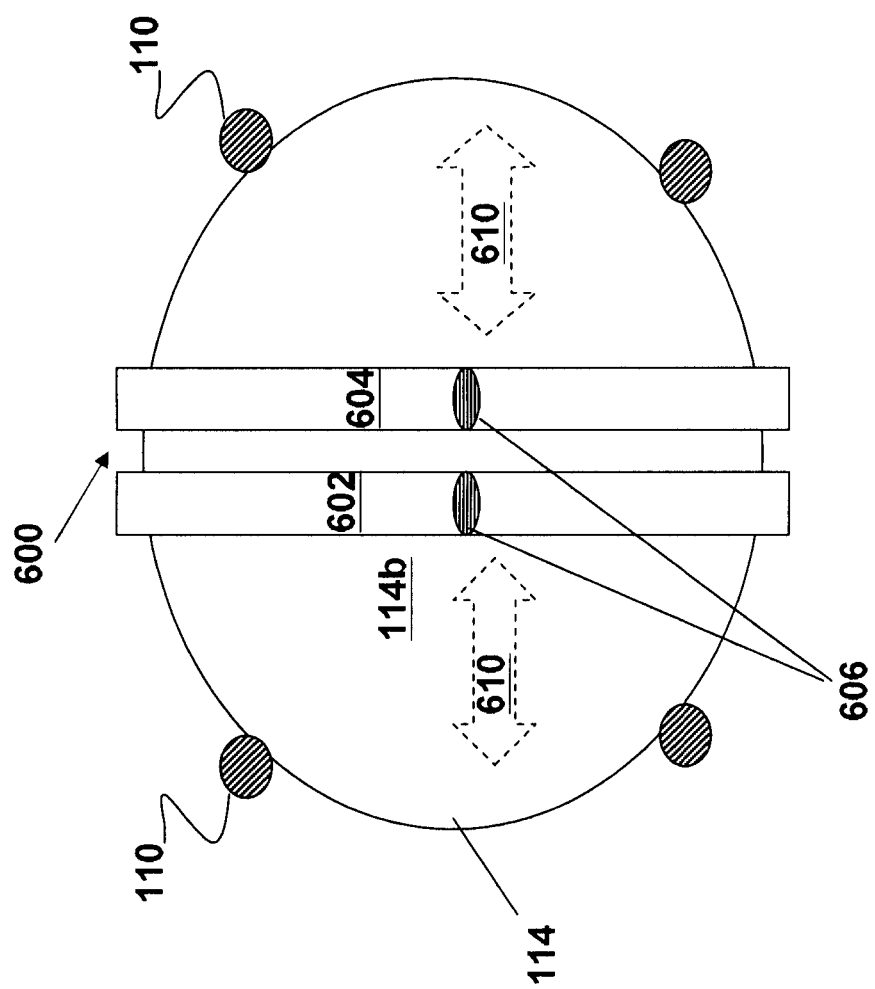
FIG. 6 is a bottom view of an embodiment of a wafer in a single wafer cleaning apparatus according to one or more aspects of the present disclosure including a plurality of spray bars having a scan mode.

Referring now to FIG. 6, illustrated is a bottom view of the wafer 114, denoted 114b. The wafer 114 is held by the wafer positioning devices 110, described in further detail above with reference to FIG. 1. FIG. 6 illustrates an embodiment of a brush bar configuration 600 including a brush bar 602 and a brush bar 604. The brush bars 602 and 604 may be substantially similar to the brush bar 112, described above with reference to FIG. 1. The brush bar 602 and 604 may be included in the single wafer cleaning apparatus 100, also described above with reference to FIG. 1.

The brush bar 602 and the brush bar 604 each include a nozzle 606. In other embodiments, the brush bar 602 and 604 may each include a plurality of nozzles, for example, as illustrated above in FIG. 3. The brush bars 602 and 604 may also each include brushes that contact the backside of the wafer. The nozzles 606 may be connected to a chemical supply. Example chemicals supplied to and by the nozzle 606 include, for example, APM (ammonia hydroxide-hydrogen peroxide-wafer mixture), de-ionized water (DIW), SC1 (de-ionized water (DI), $NH_4OH$, $H_2O_2$), diluted $NH_4OH$, SC2 (DI, HCl, $H_2O_2$), ozonated de-ionized water ($DIWO_3$), SPM ($H_2SO_4$, $H_2O_2$), SOM ($H_2SO_4$, $O_3$), SPOM, $H_3PO_4$, dilute hydrofluoric acid (DHF), HF, HF/EG, HF/$HNO_3$, $NH_4OH$, HF, and/or other suitable chemicals. The chemicals delivered via nozzle 606 may be between approximately 0 degrees Celsius and approximately 250 degrees Celsius. In a further embodiment, the chemicals delivered by nozzle 606 are between approximately 23 degrees Celsius and approximately 80 degrees Celsius. The chemicals from nozzle 502 are incident the backside 114b of the wafer 114. Though the nozzle 606 is illustrated as disposed aligned with the center of the wafer 114, other configurations are possible. In embodiments, different chemicals are delivered to each of the nozzles 606.

The brush bar 602 and the brush bar 604 are scan mode brush bars. The scan mode provides for the brush bar 602 and the brush bar 604 to traverse a portion of the wafer 114. The movement is illustrated by arrows 608 and 610, which indicate the brush bar 602 and the brush bar 604 each move along a radius of the wafer 114. The movement 608 and 610 indicates center-to-edge scanning. The movement 608 and 610 may occur simultaneously. However, other embodiments of movement are possible. It is noted that the wafer 114 may also be rotated along its radial axis during the scan movements 608 and 610. The scan speed, e.g., movement 608 and/610, may be between approximately 1 mm/second and approximately 200 mm/second.

In an embodiment, the brush bar 602 cleans a first portion of the backside of the wafer 114 (e.g., a first half) and the brush bar 604 cleans a second portion of the backside of the wafer 114 (e.g., a second half).

Thus, FIGS. 2-6 illustrate a wafer and portions of a single wafer cleaning apparatus, such as illustrated in FIG. 1. Each of the brush bars—brush bar 300, described with reference to FIG. 3; brush bar 400, described with reference to FIG. 4; brush bar 500, described with reference to FIG. 5; brush bar configuration 600, described with reference to FIG. 6—may be used as a brush bar in the wafer cleaning apparatus 100, described above with reference to FIG. 1. These brush bars are illustrated for ease of understanding and are not intended to be limiting in the embodiments possible under the present disclosure.

Figure 7:
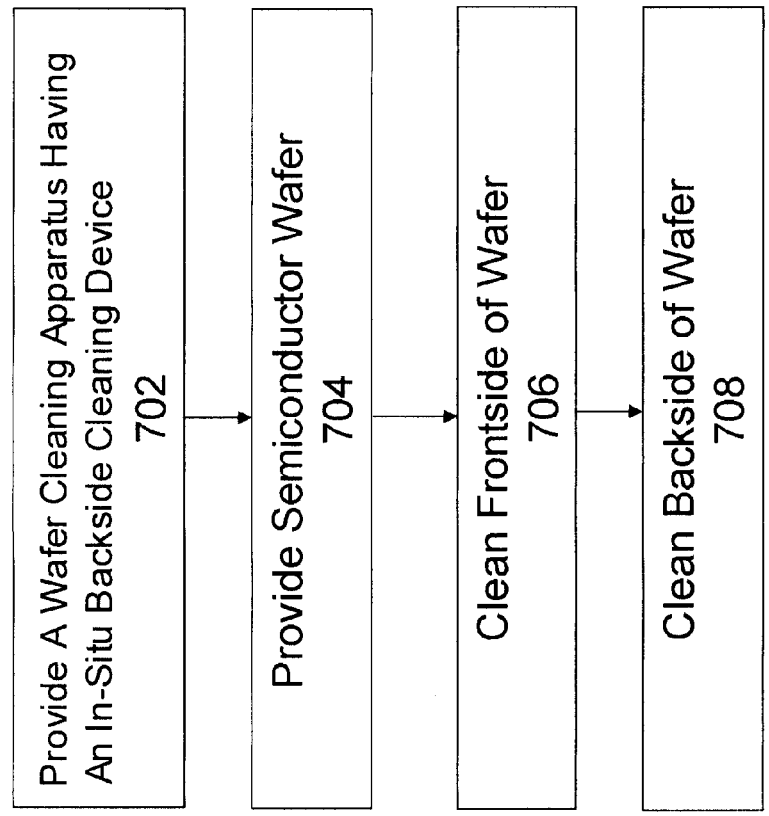
FIG. 7 is a flow chart of any embodiment of a method of cleaning a semiconductor wafer according to one or more aspects of the present disclosure.

Referring now to FIG. 7, illustrated is a method 700 of cleaning a semiconductor wafer. The method 700 may be performed using a single wafer cleaning apparatus, such as, for example, the single wafer cleaning apparatus 100, described above with reference to FIG. 1.

The method 700 begins at block 702 by providing a cleaning apparatus having an in-situ backside cleaning device. The cleaning apparatus may be a single wafer tool such that a single wafer is processed at a given time. The cleaning apparatus may be substantially similar to the single wafer cleaning apparatus 100, described above with reference to FIG. 1. The cleaning apparatus includes a device for providing chemical (e.g., a spray) onto a first surface (e.g., top surface) of a wafer and a device for providing a chemical and/or brush to a second opposing surface (e.g., bottom surface) of the wafer. The cleaning apparatus may include wafer positioning devices operable to hold and/or rotate a wafer during the time the wafer is cleaned (e.g., the front and back surfaces are cleaned).

The method 700 then proceeds to block 704 where a semiconductor wafer is provided. The wafer may have a frontside (e.g., front surface) and an opposing backside (e.g., back surface). The semiconductor wafer may be substantially similar to the wafer 114, described above with reference to FIG. 1.

The wafer may include silicon. Alternatively, the wafer includes germanium, silicon germanium or other proper semiconductor materials. The wafer may include regions where one or more semiconductor devices, or portions thereof, are formed (e.g., field effect transistors). Various isolation features may be formed in the wafer interposing various doped regions (e.g., n-wells and p-wells) formed in various active regions. The wafer includes a plurality of individual die formed thereon, which may be subsequently diced to form semiconductor devices. The wafer may be greater than approximately 250 mm. In an embodiment, the wafer is approximately 450 mm in diameter. A pattern of features may be formed on the frontside of the wafer; the pattern of features may be associated with a semiconductor device or portion thereof, such as a plurality of gate structures (e.g., polysilicon features), source/drain regions, interconnect lines or vias, dummy features, and/or other suitable patterns.

The method 700 then proceeds to block 706 where the frontside of the wafer is cleaned by the wafer cleaning apparatus. The frontside of the wafer may be cleaned by a spray cleaning. One or more sprays may be incident the frontside of the wafer. The spray(s) may include, for example, APM (ammonia hydroxide-hydrogen peroxide-wafer mixture), de-ionized water (DIW), SC1 (de-ionized water (DI), $NH_4OH$, $H_2O_2$), diluted $NH_4OH$, SC2 (DI, HCl, $H_2O_2$), ozonated de-ionized water ($DIWO_3$), SPM ($H_2SO_4$, $H_2O_2$), SOM ($H_2SO_4$, $O_3$), SPOM, $H_3PO_4$, dilute hydrofluoric acid (DHF), HF, HF/EG, $HF/HNO_3$, $NH_4OH$, HF, and/or other suitable chemicals. The spray(s) may also include an nitrogen ($N_2$) flow. The $N_2$ flow may be a high pressure gas flow. Other frontside cleaning and/or etching processes may be available and within the scope of this disclosure.

The method 700 then proceeds to block 708 where the backside of the wafer is cleaned by the wafer cleaning apparatus. Block 708 may occur substantially simultaneously with or be performed at least in part concurrently with the processes of block 706. In other words, the backside and frontside of the wafer may be cleaned concurrently and/or in-situ with one another. The block 708 may be performed in-situ with the block 706 such that the wafer is not removed from a chamber or platform during the block 706 and block 708. For example, in an embodiment, a wafer holding device maintains the wafer during block 706 and block 708 as well as any interrupt between processes.

The backside of the wafer may be cleaned by a chemical spray from one or more nozzles in addition to a physical clean by a brush (e.g., scrub brush). One or more sprays of chemical may also be incident the backside of the wafer. The spray(s) may include, for example, APM (ammonia hydroxide-hydrogen peroxide-wafer mixture), de-ionized water (DIW) including hot DIW, SC1 (de-ionized water (DI), $NH_4OH$, $H_2O_2$), diluted $NH_4OH$, SC2 (DI, HCl, $H_2O_2$), ozonated de-ionized water ($DIWO_3$), SPM ($H_2SO_4$, $H_2O_2$), SOM ($H_2SO_4$, $O_3$), SPOM, $H_3PO_4$, dilute hydrofluoric acid (DHF), HF, HF/EG, $HF/HNO_3$, $NH_4OH$, HF, and/or other suitable chemicals. The chemical and/or wafer temperature of the backside clean may be between approximately 23 degrees Celsius and approximately 80 degrees Celsius.

The backside of the wafer may be cleaned by a spray bar such as, for example, the spray bar 112, described above with reference to FIG. 1; the spray bar 300, described above with reference to FIG. 3; the spray bar 400, described above with reference to FIG. 4; the spray bar 500, described above with reference to FIG. 5; and/or the spray bar configuration 600, described above with reference to FIG. 6.

In an embodiment, the backside cleaning includes moving the wafer and/or scan bar such that the scan bar (e.g., brush) traverses a portion of the wafer. For example, the brush bar and/or wafer may be moved such that the brush bar traverses from the center of the wafer to the edge of the wafer. Exemplary embodiments are described above with reference to FIGS. 5 and 6.

The backside clean includes a physical clean by a brush. The brush may be substantially similar to as described above with reference to FIGS. 1, 3, 4, 5, and/or 6. The brush may include a plurality of flexible features (e.g., bristles) arranged in a comb-like fashion, which contact the backside of the wafer. Other embodiments are possible, including, for example, pads. Exemplary materials include polyvinyl alcohol (PVA) or other polymer. The brush may include a plurality of rotating brushes.

The wafer may be rotated as the frontside clean of block 706 and/or the backside clean of block 708 are performed. The wafer may be rotated at a speed of between approximately 10 rpm and approximately 2500 rpm.

Thus, the method 700 provides for cleaning a frontside of a wafer in-situ with the cleaning of the backside of the wafer. The in-situ cleaning is provided to a single wafer at a time. The in-situ cleaning includes a chemical and physical cleaning (e.g., with a brush) of the backside of the wafer. The in-situ cleaning may allow for substantially simultaneous cleaning of the frontside and backside of the wafer. It is noted that while simultaneous cleaning is provided for in the disclosed embodiments, it is not necessary for the cleaning processes to begin and end at the same point in time. Any amount of overlap in processing time is provided for, referred to herein a concurrently processed.

In summary, the methods and devices disclosed herein provide for in-situ frontside and backside cleaning of a single wafer. In doing so, certain embodiments of the present disclosure offer advantages over prior art devices. Advantages of embodiments of the present disclosure include improving cycle time, lowering tool cost, and improving efficiency of production. It is understood that different embodiments disclosed herein offer different disclosure, and that they may make various changes, substitutions and alterations herein without departing from the spirit and scope of the present disclosure.

Thus, an embodiment of a cleaning apparatus is described that includes a wafer positioning device operable to hold a semiconductor wafer in a first position. A first wafer cleaning device is positioned on a first side of the first position (e.g., of the wafer). The first wafer cleaning device includes a first nozzle from dispensing a chemical spray. A second wafer cleaning device is positioned on a second side of the first position, the second side being opposite (or opposing) the first side. The second wafer cleaning device includes a brush. An embodiment of a first wafer cleaning device includes the inlets 102 and 104, chamber 106, nozzle 108, etc of FIG. 1. An embodiment of a second wafer cleaning device includes the spray bar 114, also described above with reference to FIG. 1. Thus, the wafer cleaning apparatus allows for concurrent or simultaneous cleaning of two opposing sides of a semiconductor wafer, in a single wafer processing tool.

In another embodiment, a method is described. The method includes providing a single wafer cleaning apparatus (e.g., that processes a single wafer at one location at one time). A wafer is placed in the single wafer cleaning apparatus. A first chemical spray (or cleaning fluid) is dispensed onto a front surface of the wafer. A back surface of the wafer is cleaned while dispensing the first chemical spray. In a further embodiment, cleaning the back surface includes dispensing a spray and/or brush onto the back surface.

In a further embodiment, a method of cleaning a semiconductor wafer is described. The method includes positioning the semiconductor wafer in a wafer holding device and positioning a brush bar adjacent the semiconductor wafer in the wafer holding device. A first spray is dispensed onto a frontside of the semiconductor wafer while the semiconductor wafer is positioned in the wafer holding device. A backside of the semiconductor wafer is cleaned while the semiconductor wafer is positioned in the wafer holding device using the brush bar. (e.g., in an embodiment the semiconductor wafer is disposed in the same wafer holding device for both processes, without removal.)

What is claimed is:

1. A method, comprising:
   providing a single wafer cleaning apparatus having a dispenser disposed above a wafer positioning device and a brush bar disposed below the wafer positioning device;
   disposing a wafer in the single wafer cleaning apparatus on the wafer positioning device;
   dispensing a first chemical spray from the dispenser onto a front surface of the wafer;
   cleaning a back surface of the wafer using the brush bar, wherein the cleaning the back surface is performed while dispensing the first chemical spray, wherein the cleaning the back surface includes dispensing a second chemical spray from a first nozzle disposed in the brush bar, wherein the cleaning the back surface further comprises dispensing a third chemical spray from a second nozzle disposed in the brush bar, wherein the third chemical spray is different than the second chemical spray.

2. The method of claim 1, wherein the first chemical spray and the second chemical spray have a different composition.

3. The method of claim 1, wherein the brush bar is moved from a center position on the wafer to an edge position on the wafer during the cleaning.

4. A method of cleaning a semiconductor wafer, comprising:
   positioning the semiconductor wafer in a wafer positioning device;
   positioning a brush bar adjacent a backside of the semiconductor wafer in the wafer positioning device;
   dispensing a first spray onto a frontside of the semiconductor wafer while the semiconductor wafer is disposed in the wafer positioning device; and
   cleaning the backside of the semiconductor wafer while the semiconductor wafer is disposed in the wafer positioning device, wherein the cleaning includes:
      dispensing a first spray from a first nozzle disposed on a first brush bar; and
      dispensing a second spray onto the backside of the semiconductor wafer, wherein the second spray has a different composition than the first spray, wherein the second spray is dispensed from one of the first brush bar or a second brush bar.

5. The method of claim 4, wherein the first brush bar includes a plurality of nozzles disposed on the first brush bar and the cleaning the backside of the semiconductor wafer includes dispensing the first spray from each of the plurality of nozzles including the first nozzle.

6. The method of claim 4, wherein the positioning the semiconductor wafer in the wafer positioning device includes rotating the semiconductor wafer using the wafer positioning device during the cleaning of the backside of the semiconductor wafer.

7. The method of claim 6, wherein the cleaning the backside of the semiconductor wafer with the first brush bar includes moving the first brush bar across a portion of the semiconductor wafer while the semiconductor wafer is rotating.

8. The method of claim 4, wherein the dispensing the first spray and the cleaning the backside of the semiconductor wafer are performed concurrently.

9. The method of claim 4, wherein the cleaning the backside using the first brush bar includes contacting the backside of the semiconductor wafer with a brush disposed on the first brush bar.

10. The method of claim 4, wherein the cleaning the backside of the semiconductor wafer dispensing the spray from the nozzle, the nozzle being an only nozzle disposed on the first brush bar.

11. The method of claim 10, wherein the only nozzle is disposed over a center of the wafer.

12. A method of cleaning a semiconductor wafer, the method comprising:
   positioning the semiconductor wafer in a wafer positioning device;
   positioning a dispenser above and adjacent a frontside of the semiconductor wafer in the wafer positioning device;
   positioning a first brush bar below and adjacent a backside of the semiconductor wafer in the wafer positioning device;
   positioning a second brush bar below and adjacent a backside of the semiconductor wafer in the wafer positioning device, wherein the second brush bar is adjacent and spaced a distance from the first brush bar;
   dispensing a first spray onto a frontside of the semiconductor wafer using the dispenser;
   concurrently, using the first brush bar and the second brush bar to clean the backside of the semiconductor wafer while the semiconductor wafer is disposed in the wafer positioning device; wherein the using the first and second brush bars includes:
      providing a second spray using a first nozzle in the first brush bar, wherein the second spray is incident the backside of the semiconductor wafer; and
      providing a third spray using a second nozzle in the second brush bar, wherein the third spray is incident the backside of the semiconductor wafer, wherein the second and third sprays include different chemicals.

13. The method of claim 12, wherein the using the first and second brush bars to clean the backside of the semiconductor wafer includes:
   moving the first brush bar from a first center portion of the semiconductor wafer to a first edge portion of the semiconductor wafer; and
   concurrently moving the second brush from a second center portion of the semiconductor wafer to a second edge portion of the semiconductor wafer, wherein the first and second center portions are disposed between the first and the second edge portions.

* * * * *